United States Patent
Chang (10) Patent No.: US 7,960,289 B2
(45) Date of Patent: Jun. 14, 2011

(54) ETCHING METHOD, PATTERN FORMING PROCESS, THIN-FILM TRANSISTOR FABRICATION PROCESS, AND ETCHING SOLUTION

(75) Inventor: Chienliu Chang, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/514,209

(22) PCT Filed: Nov. 20, 2007

(86) PCT No.: PCT/JP2007/072880
§ 371 (c)(1), (2), (4) Date: May 8, 2009

(87) PCT Pub. No.: WO2008/069057
PCT Pub. Date: Jun. 12, 2008

(65) Prior Publication Data
US 2010/0035378 A1    Feb. 11, 2010

(30) Foreign Application Priority Data
Dec. 5, 2006   (JP) .................... 2006-328204

(51) Int. Cl.
H01L 21/302  (2006.01)
H01L 21/461  (2006.01)

(52) U.S. Cl. ........ 438/745; 438/689; 438/692; 438/754; 257/E21.245; 257/E21.246

(58) Field of Classification Search .......... 438/104, 438/689–692, 745, 754; 257/E21.245, E21.246
See application file for complete search history.

(56) References Cited

U.S. PATENT DOCUMENTS

| | | | |
|---|---|---|---|
| 4,871,692 A * | 10/1989 | Lee et al. ............. | 438/779 |
| 5,174,855 A | 12/1992 | Tanaka ............... | 156/626 |
| 6,123,824 A * | 9/2000 | Sano et al. ........... | 205/124 |
| 6,433,842 B1 * | 8/2002 | Kaneko et al. ........ | 349/43 |
| 2004/0227894 A1 * | 11/2004 | Kim et al. ............ | 349/145 |
| 2006/0113539 A1 | 6/2006 | Sano et al. ........... | 257/59 |
| 2009/0149030 A1 * | 6/2009 | Chang ............... | 438/752 |

FOREIGN PATENT DOCUMENTS

| | | |
|---|---|---|
| CN | 1400638 A | 3/2003 |
| EP | 0 396 002 | 11/1990 |
| JP | 2001-267307 | 9/2001 |
| JP | 2005-223049 | 8/2005 |

(Continued)

OTHER PUBLICATIONS

Nomura, K. et al., "Room-Temperature Fabrication of Transparent Flexible Thin-Film Transistors Using Amorphous Oxide Semiconductors," Letter to Nature, vol. 432, pp. 448-492.

(Continued)

*Primary Examiner* — Alexander G Ghyka
*Assistant Examiner* — Leonard Chang
(74) *Attorney, Agent, or Firm* — Fitzpatrick, Cella, Harper & Scinto (57) ABSTRACT

An etching method is provided in which selective etching can be carried out for an amorphous oxide semiconductor film including at least one of gallium and zinc, and indium. In the etching method, the selective etching is performed using an alkaline etching solution. The alkaline etching solution contains especially ammonia in a specific concentration range.

9 Claims, 6 Drawing Sheets

FOREIGN PATENT DOCUMENTS

| | | |
|---|---|---|
| JP | 2005-258115 | 9/2005 |
| JP | 2006-269469 | 10/2006 |
| WO | WO 2006/051995 A1 | 5/2006 |

OTHER PUBLICATIONS

Yabuta, H. et al., "High-Mobility Thin-Film Transistor with Amorphous InGaZno4 Channel Fabricated by Room Temperature rf-Magnetron sputtering," Applied Physics Letters, vol. 89, No. 11, pp. 112123-1, Sep. 11, 2006.

Chinese Office Action issued in the counterpart application No. 200780045098.0 dated Jun. 10, 2010, along with English-language translation—11 pages.

Full English-language translation of CN 1400638—9 pages.

Korean Office Action issued in counterpart application No. 10-2009-7013545, dated Feb. 15, 2011—5 pages.

* cited by examiner

ETCHING METHOD, PATTERN FORMING PROCESS, THIN-FILM TRANSISTOR FABRICATION PROCESS, AND ETCHING SOLUTION

TECHNICAL FIELD

This invention relates to an etching method, a pattern forming process, a thin-film transistor fabrication process and an etching solution (etchant) which are used in fabricating microelectronic component parts such as semiconductor devices, integrated circuits, and electrodes.

BACKGROUND ART

In recent years, as miniaturization, weight saving and electric power saving of electronic equipment are increasingly promoted, attention in the field of display is being focused on a semiconductor composed of an oxide IGZO including indium (In), gallium (Ga) and zinc (Zn). An IGZO amorphous oxide semiconductor film can be formed on a resin film at a low temperature, and hence, its application to light-weight portable electronic products in the future is being studied.

Heretofore, films formed of the amorphous oxide including In, Ga and Zn have been subjected to patterning by a lift-off method (K. Nomura et. al., Nature, Vol. 432, 25, Nov. 2004, pp. 488-492). In the lift-off method, however, photoresists have such low heat resistance as to melt and deform when high-temperature processing is carried out. In the step of removing photoresists, the pattern edges of deposited films may be turned up.

Japanese Patent Application Laid-Open No. 2005-258115 discloses that oxides which contain indium and zinc (i.e., IZOs) can be etched with oxalic acid, a mixed acid of phosphoric acid, acetic acid and nitric acid or a cerium (IV) ammonium nitrate aqueous solution.

However, etching solutions of the acid type as in the above etches every different coexistent film at the same etch rate, when etching an amorphous oxide semiconductor composed of an oxide including at least one of Ga and Zn, and In (i.e., IGZO, IZO or IGO).

DISCLOSURE OF THE INVENTION

The present invention has been accomplished as a result of extensive studies made with the aim of solving the above problem, and is directed to an etching method for etching an amorphous oxide semiconductor film including at least one of gallium and zinc, and indium, characterized by subjecting the amorphous oxide semiconductor film to selective etching with an alkaline etching solution.

The present invention is further directed to a pattern forming process for forming a pattern of an amorphous oxide semiconductor, characterized by having the steps of forming an amorphous oxide semiconductor film including at least one of gallium and zinc, and indium, and subjecting the amorphous oxide semiconductor film to selective etching with an alkaline etching solution.

The present invention is still further directed to a thin-film transistor fabrication process having the steps of forming source and drain electrodes, a gate electrode, a gate insulating layer and a semiconductor layer, characterized in that the step of forming the semiconductor layer has the steps of forming an amorphous oxide semiconductor film including at least one of gallium and zinc, and indium, and subjecting the amorphous oxide semiconductor film to selective etching with an alkaline etching solution.

The present invention is still further directed to an etching solution for etching an amorphous oxide semiconductor film including at least one of gallium and zinc, and indium, characterized in that the etching solution contains ammonia in a concentration selected within the range of from 4.6% by mass or more to 28% by mass or less.

According to the present invention, the semiconductor film of an amorphous oxide selected from IGZO, IZO and IGO can be etched with high selectivity with respect to a different film(s) and the substrate surface.

Using a pattern forming process and a thin-film transistor fabrication process which utilize such an etching method, device characteristics can be kept from scattering and improved in stability and uniformity.

Further features of the present invention will become apparent from the following description of exemplary embodiments with reference to the attached drawings.

BEST MODE FOR CARRYING OUT THE INVENTION

The amorphous oxide semiconductor film usable in the present invention contains at least one of Ga and Zn, and In.

In the following description, an oxide including In, Ga and Zn (In—Ga—Zn—O) is hereinafter referred to as IGZO to simplify the description. Similarly, an oxide including In and Zn (In—Zn—O) is referred to as IZO, and an oxide including In and Ga (In—Ga—O) is referred to as IGO.

The amorphous oxide semiconductor film used in the present invention may be one in which at least one of impurities selected from Sn, Al, Sb, Cd, Ge, P, As, N and Mg is added to IZO, IGZO and IGO. In this case, however, impurities may adversely affect the properties of semiconductor films, and hence the acceptable content of the impurities is 10 atom % or less.

In the present invention, at least one of Ga and Zn, and In and oxygen (O), in total is preferably in a content of 90 atom % or more, more preferably 95 atom % or more, and most preferably 99 atom % or more.

Ga atoms and Zn atoms in IGZO used in the present invention may preferably be at least in a content of 5 atom % or more, and more preferably 10 atom % or more.

Zn atoms in IZO used in the present invention may preferably be at least in a content of 5 atom % or more, and more preferably 10 atom % or more.

Ga atoms in IGO used in the present invention may preferably be at least in a content of 2 atom % or more, and more preferably 5 atom % or more.

A material for the amorphous oxide semiconductor film used in the present invention is preferably an amorphous oxide semiconductor having an electron carrier concentration of less than $10^{18}/cm^3$. In the present invention, the amorphous oxide may be one in which micro crystallite regions of IGZO, IZO or IGO are contained in the amorphous oxide film. Specifically, the amorphous oxide film is made up of In—Ga—Zn—O, and, assuming that it is crystalline, its composition is represented by $InGaO_3(ZnO)_m$ (m is a natural number of less than 6).

The amorphous oxide semiconductor film may be formed on a layer or substrate different in compositional ratio from the amorphous oxide semiconductor film. In particular, even when it is formed on an oxide layer as a layer different in compositional ratio from the amorphous oxide semiconductor film, high etching selectivity can be achieved. Further, the present invention enables etching to be precisely controlled when a device is fabricated in which oxides which contain indium in compositional ratios different from one another are coexistent. Specifically, good selective etching can be carried out with respect to double-layer structures such as IZO/ITO (indium-tin oxide), IGZO/ITO and IGO/ITO.

The alkaline etching solution used in the present invention contains preferably ammonia.

In the case when ammonia is contained in the etching solution in the present invention, the ammonia concentration may preferably be within the range of from 4.6% by mass to 28% by mass.

When the ammonia concentration is adjusted within the above concentration range in the present invention, the etching selectivities of IGZO to ITO, IZO to ITO and IGO to ITO are 860 to 3500, 960 to 2,200 and 580 to 1,500, respectively.

Further, to achieve the value of about 3.1 to 3.8 as the etching selectivity of IGZO to IGO, it is desirable that the ammonia concentration is adjusted within the range of 6% by mass or more and 10% by mass or less.

When the etching solution in the present invention is used, the etch rates of indium oxides decrease in the order of IGZO, IZO, IGO and ITO. All the etching selectivities of IGZO, IZO and IGO to ITO are on the order of a double figure or more.

The present invention can improve production yields when semiconductor devices are fabricated by using, as semiconductor active layers, semiconductor films of the above indium oxides such as IZO, IGZO and IGO. The present invention is effective especially when semiconductor devices are fabricated on a large-area substrate.

In the etching step in the present invention, either a negative resist or a positive resist may be used. In the case where the positive resist is used as an etching mask, there is a possibility that the etching solution which contains ammonia will peel off the positive resist, and hence, long-time dip etching is not preferred. Accordingly, where an etching solution having an ammonia concentration as high as 28% by mass is used, etching time may preferably be 30 minutes or less, and more preferably 15 minutes or less.

Thus, taking into account the etch rate as well, in the case where the positive resist is used as an etching mask, the upper limit of etching thickness is preferably 150 nm in the case of IGZO, 100 nm in the case of IZO, and 65 nm in the case of IGO.

In order to avoid the peeling problem of the resist, it is also preferable to use as a material for the etching mask a negative resist having strong resistance to alkali solutions, as exemplified by a photosensitive polyimide.

Temperature of the etching solution used in the etching step in the present invention may be room temperature (about 20° C.). The conductivities of the semiconductor films of the amorphous oxides such as IZO, IGZO and IGO are greatly changed depending on the temperature, and hence it is preferable not to vary the temperature as far as possible during the etching. It is also preferable to set etching process temperature to be not higher than 120° C., because, if the etching solution has a high temperature, ammonia and water evaporate to cause variations in concentration. It is further preferable to set etching process temperature to be not higher than 100° C.

Where an amorphous oxide film formed on a plastic substrate is selectively etched, the ammonia concentration may preferably be 4.6% by mass or more to 10.5% by mass or less. When the ammonia concentration is adjusted within such a concentration range, the plastic substrate can be prevented from remarkably deteriorating or being decomposed (such as dissolving or swelling) for a certain time (at least 15 minutes or more).

The alkaline etching solution which contains ammonia barely etches, e.g., silicon nitride (SiN), which is used in gate insulating films (also called gate insulating layers). Further, it does not substantially etch dielectric materials such as silicon oxide (SiO), silicon oxynitride (SiON), hafnium oxide (HfO), hafnium aluminum oxide (HfAlO), hafnium silicon oxynitride (HfSiON) and yttrium oxide (YO). Accordingly, it is preferable that the etching step in the present invention is employed when thin-film transistors (TFTs) are fabricated using these materials in the gate insulating films.

In the present invention, alkaline etching solutions containing alkaline substance such as sodium hydroxide, potassium hydroxide or calcium hydroxide may also be used as etching solutions for the semiconductor films of amorphous oxides such as IGZO, IGO and IZO.

The constitution of the thin-film transistors for which the etching step in the present invention is usable will be described below.

Figure 1:
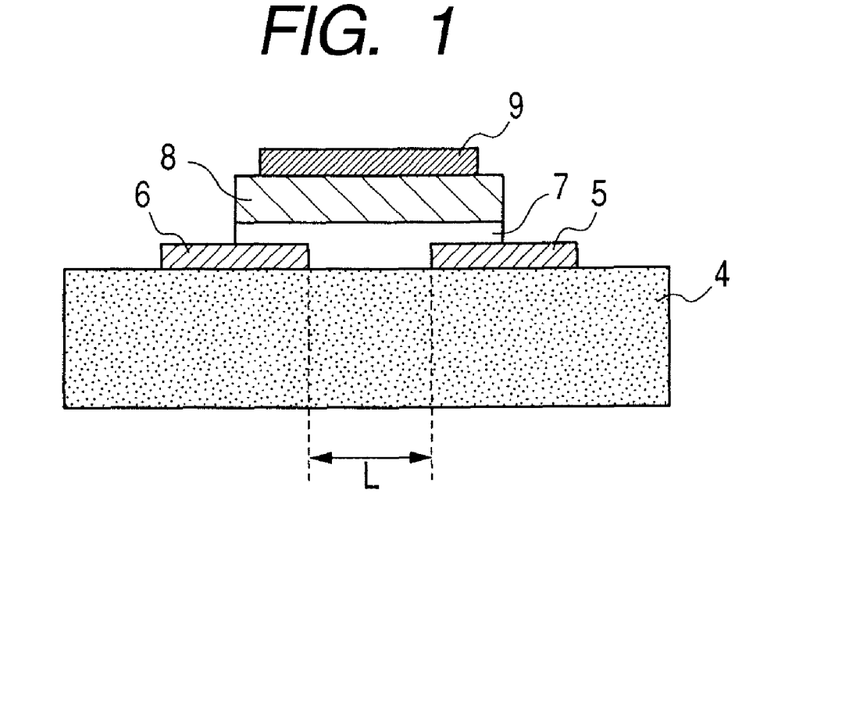
FIG. 1 is a schematic sectional view showing the structure of a TFT (thin-film transistor) fabricated according to the process of the present invention.

FIG. 1 is a schematic sectional view of a top gate type thin-film transistor. As shown in FIG. 1, reference numeral 4 denotes a substrate formed of, e.g., glass, quartz glass or silicon, on the surface of which an insulating layer has been formed. Reference numerals 5 and 6 are a drain electrode and a source electrode, respectively, which are formed of an oxide semiconductor such as ITO or a metal such as aluminum. Reference numeral 7 denotes a semiconductor layer (called an active layer or a channel layer) which is a semiconductor film formed of an amorphous oxide such as IGZO, IGO or IZO. Reference numeral 8 denotes a gate insulating film formed of the afore-mentioned dielectric material. Reference numeral 9 denotes a gate electrode formed of an oxide semiconductor such as ITO or a metal such as aluminum. Reference character L denotes channel length. The etching step of the present invention may preferably be used when the semiconductor layer 7 is etched.

Figure 2:
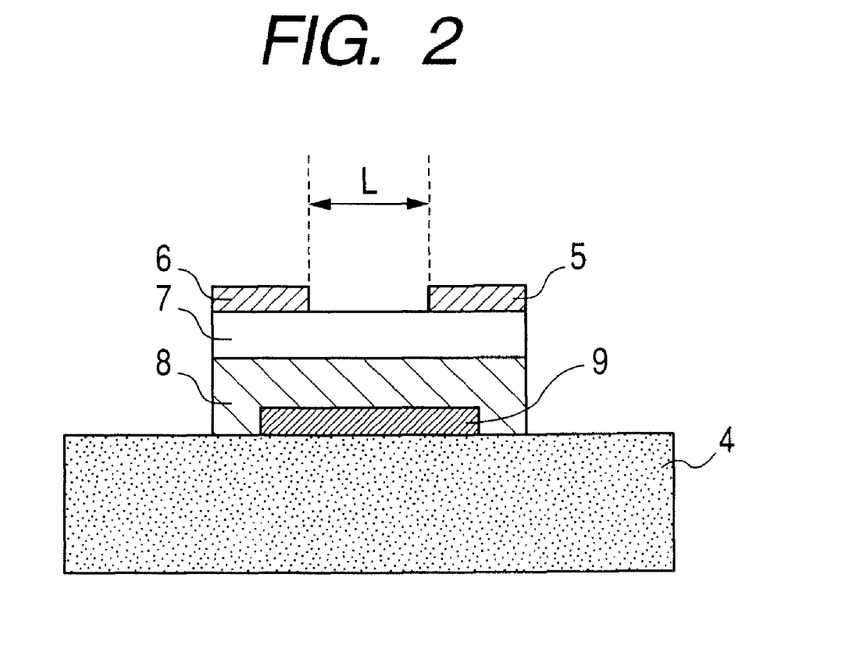
FIG. 2 is a schematic sectional view showing the structure of a TFT fabricated according to the process of the present invention.

FIG. 2 is a schematic sectional view of a bottom gate type thin-film transistor. The same parts as in FIG. 1 are denoted by the same reference numerals. The etching step in the present invention can suitably be used when the semiconductor layer 7 is etched.

Thin-Film Transistor
Fabrication Process 1

A top gate type TFT fabrication process is described below with reference to FIGS. 3A to 3K.

Figure 3A:
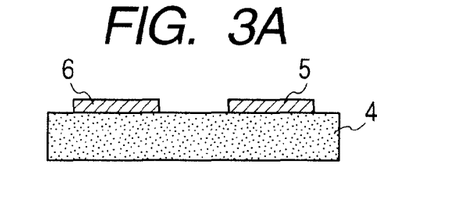
FIGS. 3A, 3B, 3C, 3D, 3E, 3F, 3G, 3H, 3I, 3J and 3K are schematic views showing a flow sheet of how a TFT is fabricated according to the process of the present invention.

As shown in FIG. 3A, for example, a glass sheet (CORNING 1737; glass transition temperature: 640° C.) of 500 μm in thickness is used as a substrate 4. Then, on the substrate surface, for example, a polycrystalline ITO film of 250 nm in layer thickness is formed by reactive sputtering. Next, the film formed is patterned by dry etching to form a drain electrode 5 and a source electrode 6 which are formed of ITO.

Figure 3B:
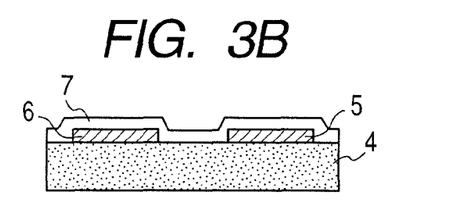

As shown in FIG. 3B, on the drain electrode 5 and the source electrode 6, an IGZO film of 50 nm in layer thickness which is to constitute a semiconductor layer 7 is formed by reactive sputtering. As the IGZO film, it is preferable to use one having an electron carrier concentration of less than $10^{18}/cm^3$.

Figure 3C:
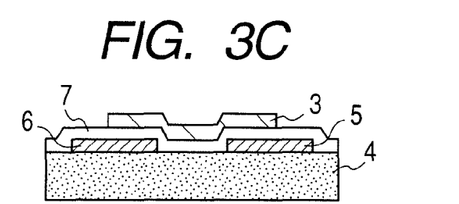
Figure 3D:
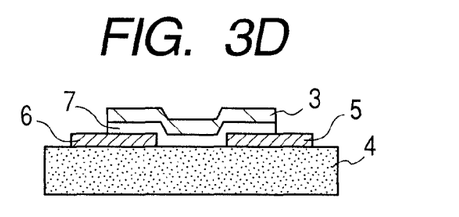
Figure 3E:
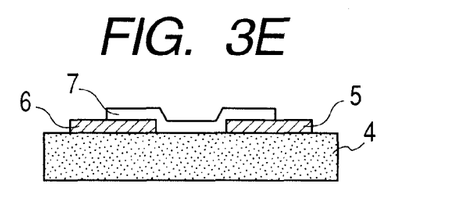

FIGS. 3C to 3G are views showing steps taken to uncover contact areas for the wiring of the drain electrode 5 and source electrode 6. As shown in FIG. 3C, a resist pattern 3 is formed as an etching mask. Then, as shown in FIGS. 3D and 3E, the IGZO film is etched with the alkaline etching solution to form the semiconductor layer 7. Thus, the contact areas of the drain electrode 5 and source electrode 6 come uncovered. In this occasion, an aqueous ammonia solution of 10.5% by mass in concentration is used at room temperature, where the etching selectivity of IGZO to ITO is about 3,000. That is, the etch rate of IGZO is sufficiently high and the etch rate of ITO is sufficiently low. Hence, the IGZO is selectively removed by etching, and the ITO is barely etched away.

As shown in FIG. 3E, after the semiconductor layer 7 has been formed, the resist pattern layer 3 is removed with a resist release medium such as acetone.

Figure 3F:
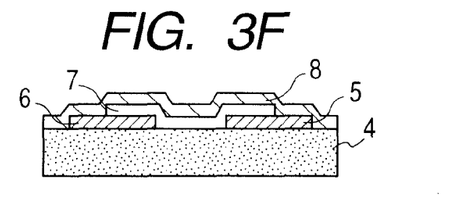

As shown in FIG. 3F, for example, a silicon nitride (SiN) film of 100 nm in layer thickness is formed as a gate insulating film 8 on the outermost surface of the top side of the substrate 4 by reactive sputtering.

In place of the silicon nitride film, the afore-mentioned dielectric material may also be used to form the gate insulating film 8.

Figure 3G:
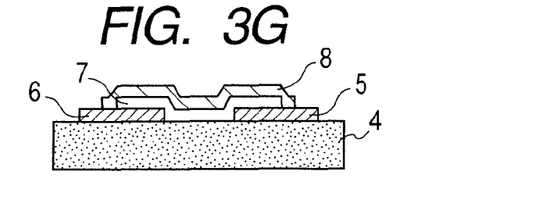

Next, as shown in FIG. 3G, the gate insulating film 8 is formed into a pattern by photolithography and RIE (reactive ion etching). When the silicon nitride film is subjected to dry etching by the RIE, a carbon type gas (e.g., $CF_4$) can be used to prevent the ITO drain electrode 5 and source electrode 6 from being damaged. This is considered to be due to the following reason. That is, ions and radicals generated from such a carbon fluoride type gas by the reaction in plasma can not easily etch the indium oxide. This is because the reaction product of indium with fluorine, $InF_3$, has a boiling point of about 1,200° C. and has such a low volatility and low vapor pressure as to not to be easily released from the substrate surface at room temperature, so that it is difficult for etching to proceed.

The reason why the gate insulating film 8 covers the semiconductor layer 7 is that a gate electrode 9 and the semiconductor layer 7 are prevented from coming into contact with each other. If this semiconductor layer 7 is uncovered to come into contact with the gate electrode 9, the etching selectivity of the gate electrode 9 to the drain electrode 5 and source electrode 6 must be set to be high in the step shown in FIG. 3J. Further, the etching selectivity of the gate electrode 9 to the semiconductor layer 7 must also be set to be high. Thus, this makes it difficult to control etching conditions.

Figure 3H:
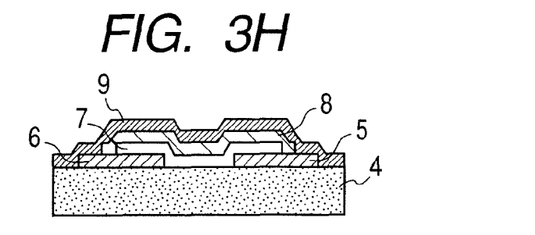

As shown in FIG. 3H, on the surface of the uppermost side of the substrate 4, a low-resistance IZO film of 90 nm in layer thickness which is to constitute the gate electrode 9 is formed by reactive sputtering.

Figure 3I:
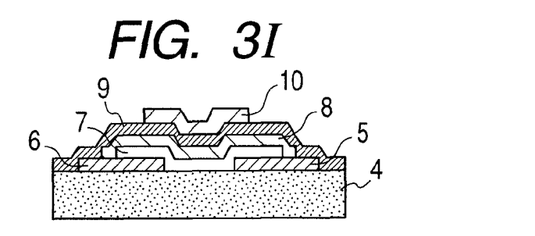

As shown in FIG. 3I, on the IZO film, a resist pattern 10 is formed by photolithography. In this case, a negative resist is preferred as a resist material.

Figure 3J:
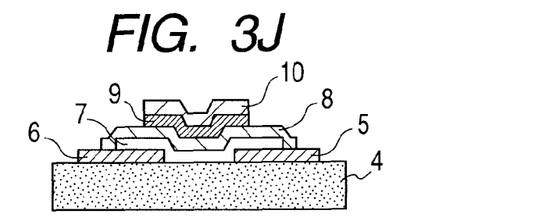

As shown in FIG. 3J, the IZO film is etched with the etching solution which contains ammonia, to form the gate electrode 9. For example, an aqueous ammonia solution of 10.5% by mass in concentration is used at room temperature, where the etching selectivity of IZO to ITO is about 800. That is, the IZO film which is to constitute the gate electrode 9 can selectively be etched with the etching solution containing ammonia.

The etching solution containing ammonia does not substantially etch the gate insulating film 8.

Figure 3K:
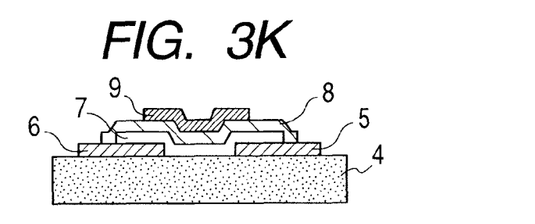

As shown in FIG. 3K, the resist pattern layer 10 is removed by ashing which uses a resist release medium such as ozone. Thus, a TFT can be fabricated which is made up of three electrodes, the gate electrode, the source electrode and the drain electrode, and the indium-containing oxide as the semiconductor.

Thin-Film Transistor
Fabrication Process 2

A bottom gate type TFT fabrication process is described below with reference to FIGS. 4A to 4D.

Figure 4A:
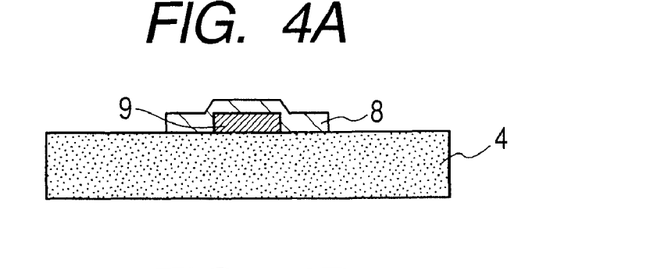
FIGS. 4A, 4B, 4C and 4D schematically show a flow sheet of how a TFT is fabricated according to the process of the present invention.

First, using as a substrate 4 a glass sheet of 500 μm in thickness, an ITO layer of 250 nm in layer thickness is formed on the surface of the substrate 4 by reactive sputtering.

Next, on the surface of the ITO layer, which is to constitute a gate electrode layer 9, a resist layer is formed in a pattern as an etching mask by photolithography. Then, the ITO layer is etched with an aqua regia type etching solution, and thereafter the resist is removed. Next, a silicon nitride film of 100 nm in layer thickness which is to constitute a gate insulating film 8 is formed by reactive sputtering, followed by patterning by photolithography and dry etching.

FIG. 4A is a diagrammatic sectional view showing a structure in where the resist has been removed after the dry etching of the gate insulating film 8 formed of silicon nitride. In place of the silicon nitride film, the gate insulating film 8 may also be formed by using any of the following materials: for example, silicon oxide (SiO), silicon oxynitride (SiON), hafnium oxide (HfO), hafnium aluminum oxide (HfAlO), hafnium silicon oxynitride (HfSiON) and yttrium oxide (YO).

In order to make voltage applicable to the gate electrode 9, part of the gate electrode 9, which constitutes a contact pad, is uncovered with not all the top of the gate electrode 9 being covered with the gate insulating film 8. The contact pad of the gate electrode 9 is in the direction perpendicular to the paper surface as viewed in FIG. 4A, and is not shown in FIG. 4A.

Next, on that layer, an IGO film of 60 nm in layer thickness which is to constitute a semiconductor layer 7 called an active layer or a channel layer is formed by reactive sputtering. Then, on the surface of the IGO layer, a resist layer 3 is formed as an etching mask by photolithography.

Figure 4B:
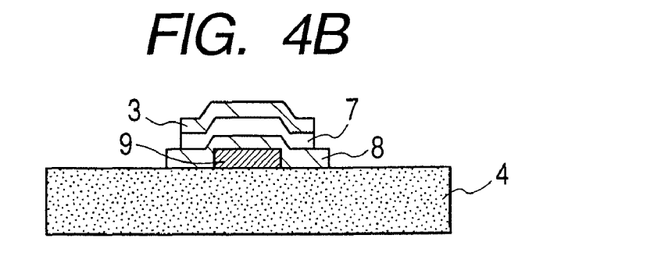

Next, as shown in FIG. 4B, the IGO layer is etched with the afore-mentioned alkaline etching solution which contains ammonia, to form the semiconductor layer 7.

As shown in Example 1 given later, where an aqueous ammonia solution of 10.5% by mass in ammonia concentration is used at room temperature, the etching selectivity of IGO to ITO is about 930. That is, the use of the etching solution which contains ammonia enables the IGO layer to be selectively etched even when the contact pad is kept uncovered at part of the gate electrode 9 formed of ITO.

If an etching solution having no etching selectivity is used in this step, the etching solution soaks into the interface between the gate electrode 9 and the gate insulating film 8 to make the channel width of the TFT narrower than the value designed. This brings about a decrease in on-state electric current of the TFT. This also makes it difficult to control characteristics for each TFT, making TFTs unsuitable for mass production.

Figure 4C:
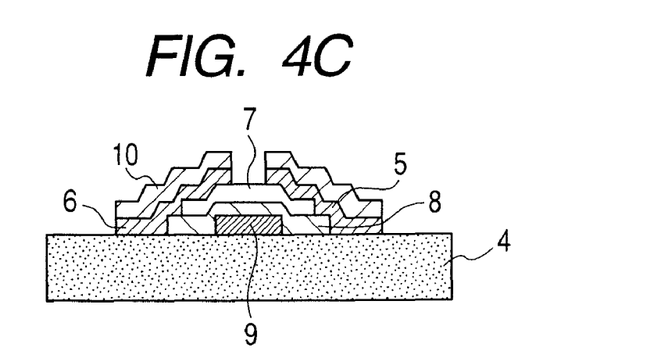

Next, the resist 3 is removed, and then a low-resistance IGZO film of 100 nm in layer thickness which is to constitute the drain electrode and the source electrode is formed by reactive sputtering. This low-resistance IGZO film can be formed by sputtering, and has electric resistance lower than the semiconductor layer 7 formed of IGO.

Next, on the surface of the IGZO film, a resist layer 10 is formed in a pattern as an etching mask by photolithography. Thereafter, as shown in FIG. 4C, the IGZO film is etched with the alkaline etching solution described later which contains ammonia, to form a drain electrode 5 and a source electrode 6. In this case, the contact pad of the gate electrode layer 9 formed of ITO comes into close contact with the IGZO film, and hence this requires selective etching of IGZO with respect to ITO. In this case, as shown in Example 1 given later, an aqueous ammonia solution adjusted to a concentration of 6.4% by mass is used at room temperature to carry out the etching. The etching selectivity of IGZO to ITO in this case is about 2,500, and the etching selectivity of IGZO to IGO is about 3.8.

That is, the drain electrode layer 5 and source electrode layer 6 formed of IGZO can selectively be etched substantially without etching the semiconductor layer 7 formed of IGO and the gate electrode layer 9 formed of ITO.

Since the etching selectivity of IGZO to IGO is about 3.8, it is preferable to precisely control etching time in the step of forming the drain electrode layer 5 and the source electrode layer 6 by etching.

Figure 4D:
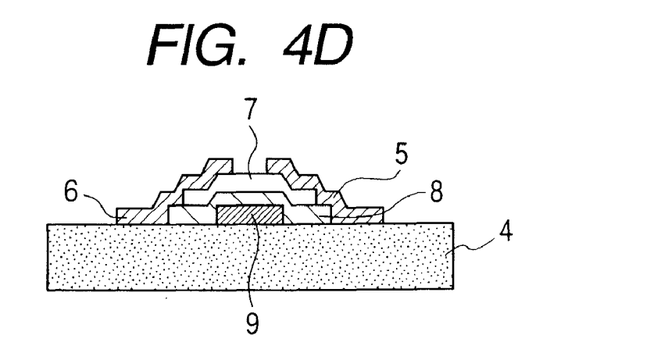

Finally, as shown in FIG. 4D, the resist layer 10 is removed with a resist release medium such as acetone.

Thus, a thin-film transistor can be fabricated in which all the electrodes and active layer are made up of oxides which contain indium.

EXAMPLES

Example 1

Measurement of Etch Rate

In Example 1, the etching methods of the present invention for etching amorphous oxide films including IZO, IGZO, IGO and ITO will be demonstrated. The following Examples are described under preferable conditions within the scope of the present invention.

First, samples for experiment were prepared according to the procedure as described below.

To examine the etch rates of an IGZO film, an IZO film and an IGO film, Si substrates (525 μm in thickness) on each of which an oxide film of 100 nm in thickness was formed were used as substrate members. These oxide films function as etching stoppers. Specifically, three Si substrates were prepared for use. Then, on each Si substrate, an oxide semiconductor film composed of any one of the IGZO film, the IZO film and the IGO film was formed under the conditions as shown in Table 1 by the reactive sputtering as described in the following publication: Applied Physics Letters, 11 Sep. 2006, Vol. 89, No. 11, pp. 112123-1 to 112123-3. The IGZO, IZO and IGO thin films formed were subjected to incident X-ray diffraction analysis (angle of incidence: 0.5 degree) to find that no clear diffraction peak was detected. It was ascertained from this result that the IGZO, IZO and IGO thin films formed were amorphous.

To examine the etch rate of ITO, a polycrystalline ITO film of 29 nm in layer thickness was formed on a glass substrate. In this ITO sample, the glass substrate functions as an etching stopper.

TABLE 1

| Indium Oxide Film Forming Conditions | | | |
|---|---|---|---|
| Material: | IGZO | IZO | IGO |
| O$_2$ partial pressure: | 3.40% | 0.97% | 0.97% |
| Film forming pressure: (Pa) | 0.5 | 0.4 | 0.4 |
| Layer thickness: | 563 nm | 393 nm | 325 nm |

Next, the surface of part of each thin film was provided with a masking material in a pattern so that the state of etching could be precisely observed for each of the etching areas and non-etching areas. Specifically, a resist pattern composed of lines each 100 μm in width with a space 100 μm in width interposed between the adjacent lines was formed on each of the IGZO, IZO, IGO and ITO thin films by known photolithography. A positive resist AZ1500 (20 cp), available from Clariant AG, was used as the resist.

Next, DI water (deionized water) was added to ammonia solutions (ammonia concentration: 28.0% by mass) to prepare ammonia water etching solutions with different concentrations. The above samples were immersed in the etching solutions with concentration thus adjusted, to thereby subject to wet etching the IGZO, IZO, IGO and ITO thin films each of which was uncovered from the resist pattern on the sample.

After the etching was completed, the resist of each sample was peeled off with acetone, and the resultant patterns of indium oxide films were observed. The differences in height (steps) produced by the etching were measured with a step meter (Alpha Step) and an ellipsometer (manufactured by Tencor Corporation) to accurately calculate etch rates.

Figure 5:
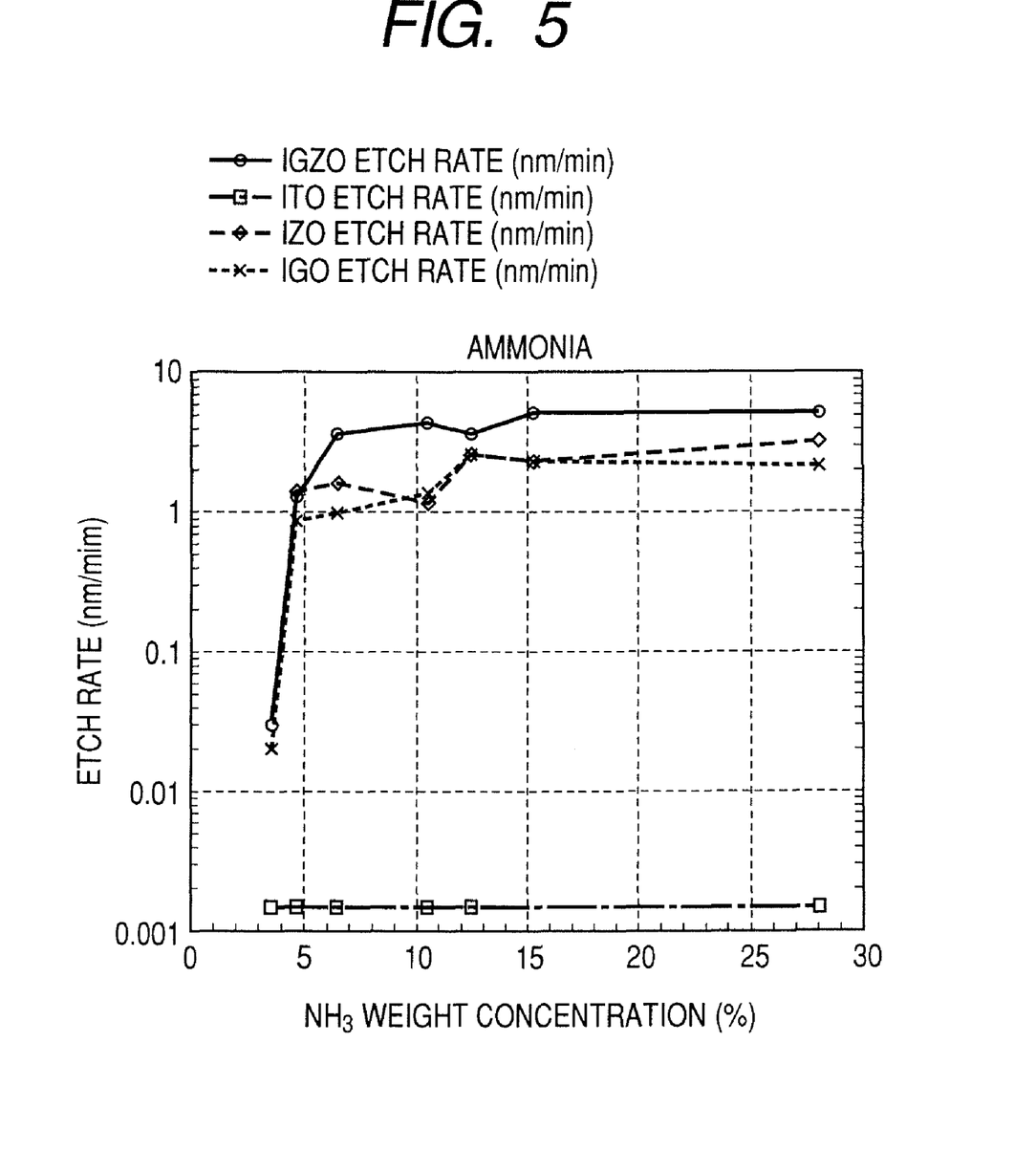
FIG. 5 is a graph showing the ammonia concentration dependence of the etch rate of an indium oxide film, to demonstrate an etching solution which contains ammonia according to Example 1 in the method of the present invention.

The results are shown in FIG. 5. FIG. 5 is a graph showing the ammonia concentration dependence of the etch rates of IZO, IGZO, IGO and ITO at room temperature (about 20° C.). In FIG. 5, the ordinate represents the etch rate (nm/min.) and the abscissa represents the ammonia concentration (% by mass).

Figure 6:
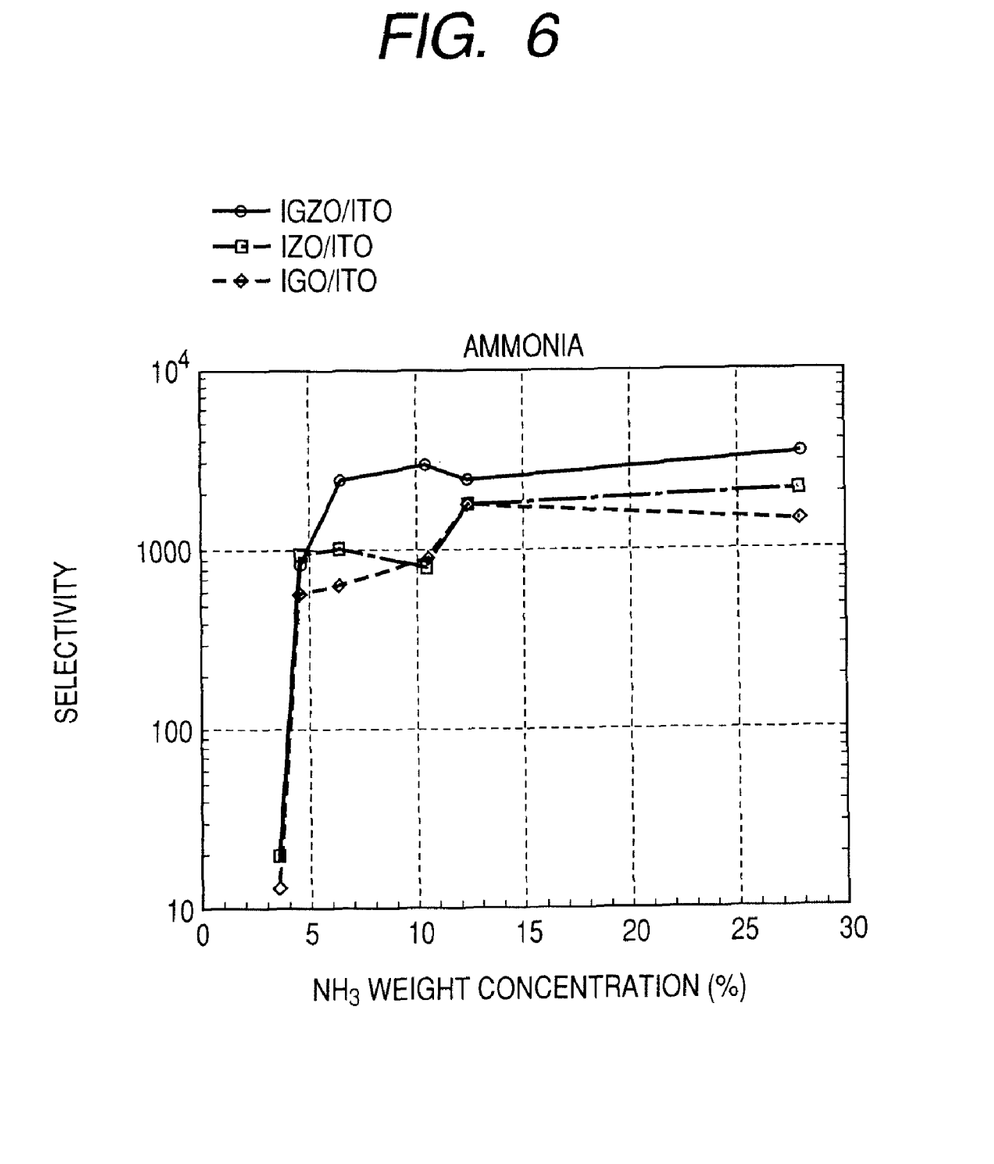
FIG. 6 is a graph showing the ammonia concentration dependence of the etching selectivity of indium oxide films to ITO, to demonstrate an etching solution which contains ammonia according to Example 1 in the method of the present invention.

FIG. 6 is a graph showing the ammonia concentration dependence of the etching selectivities of IZO, IGZO and IGO to ITO, converted from the data of FIG. 5. In FIG. 6, the ordinate represents the etching selectivity to ITO and the abscissa represents the ammonia concentration (% by mass).

As is clear from FIG. 5, the etching selectivity is seen to be high when the ammonia concentration is 4.6% by mass or more and 28.0% by mass or less (the volume ratio of the pure water for dilution to the ammonia stock solution is in the range of from 0.0 to 3.0). More specifically, the etch rate of the amorphous oxide semiconductor film which contains at least one of gallium and zinc, and indium, is apparently higher than that of ITO.

As can be seen from FIG. 6, the etch rates of IGZO, IZO and IGO to ITO within the above range of ammonia concentration are from 860 to 3,500, from 960 to 2,200 and from 580 to 1,500, respectively.

Within the range of ammonia concentration of less than 4.6% by mass and 3.6% by mass or more, the etch rates of IGZO, IZO and IGO and the etching selectivity to ITO decrease abruptly to about 1/50. More specifically, when the ammonia concentration is less than 4.6% by mass, the etching selectivity to ITO is substantially lost and also the etch rate decreases.

From the foregoing results, it is desirable that the etching solution which contains ammonia has the ammonia concentration within the range of 4.6% by mass or more and 28% by mass or less.

The use of the etching solution which contains ammonia within the above concentration range enables the etching to be carried out under the conditions that the etch rates of indium oxides are in the order of IGZO, IZO, IGO and ITO. In particular, all the etching selectivities of IGZO, IZO and IGO to ITO can be controlled to be on the order of a double figure or more. However, since the relative etching selectivity among the three IGZO, IZO and IGO is not high, the etching time, the layer thicknesses of etching objects, etc. should be adjusted when the etching is carried out within the above concentration range. For example, the etching selectivity of IZO to IGO is from 0.85 to 1.65.

Where the etching selectivity of IGZO to IGO (about from 3.1 to 3.8) should be maintained, it is desirable for the ammonia concentration to be adjusted within the range of approximately 6.4% by mass or more and 10.5% by mass or less.

Example 2

Selective Etching

Figure 7A:
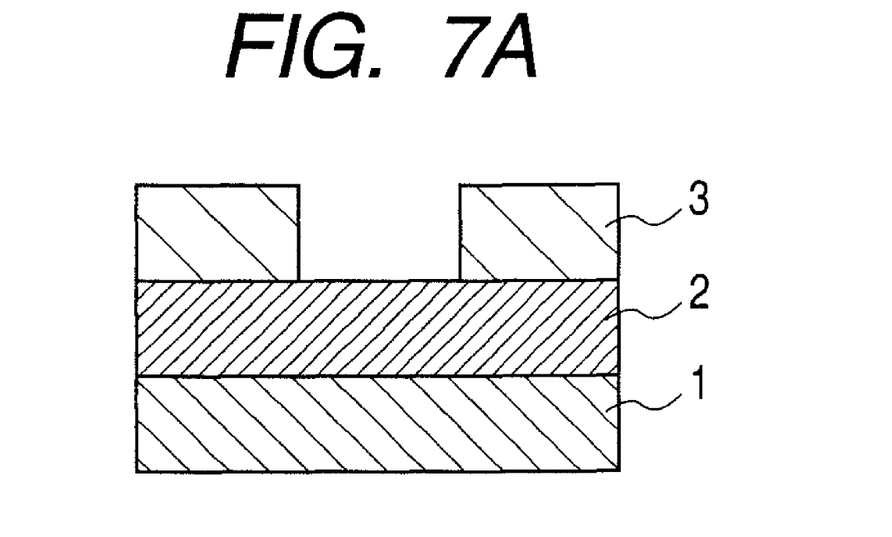
FIGS. 7A and 7B show a schematic sectional view of a TFT before being etched, and a schematic sectional view of a TFT after being etched, respectively, to illustrate an etching method according to Example 2 in the method of the present invention.
Figure 7B:
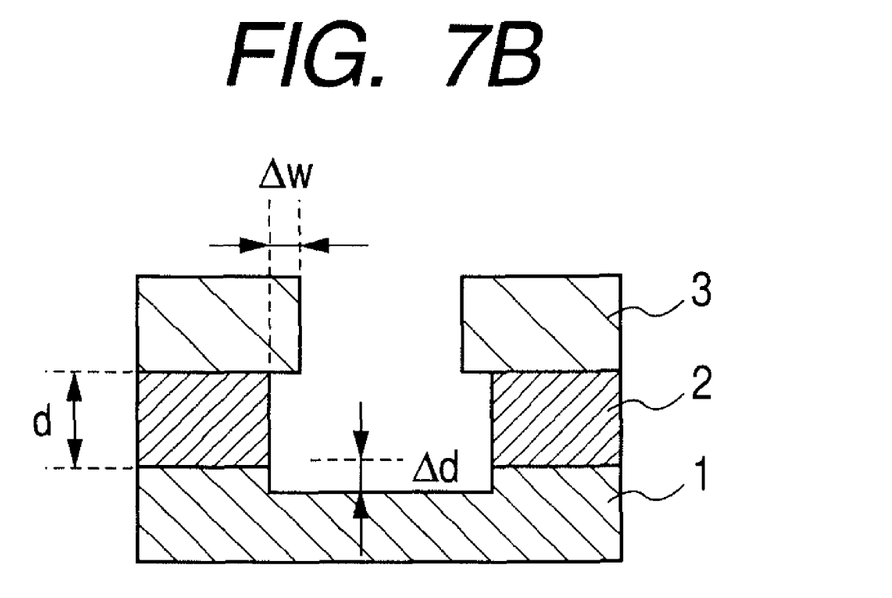

FIGS. 7A and 7B are a diagrammatic sectional view to illustrate a selective-etching method according to Example 2 of the present invention. In FIGS. 7A and 7B, reference numeral 1 denotes a material layer having a relatively low etch rate; and 2, a material layer having a relatively high etch rate. Reference numeral 3 denotes a resist layer which serves as an etching mask. Where the material layers 1 and 2 each have a low etching selectivity, the excess etch depth Δd of the material layer 1 becomes close to the undercut level Δw of the material layer 2. Where a thin-film transistor using such a structure is fabricated, the problem of scattering is raised in that the thin-film transistor has non-uniform characteristics.

An ITO layer is used as the material layer 1 and at least one selected from the group consisting of IZO, IGZO and IGO is used to form the material layer 2, so that the etching selectivity of the material layer 2 to the material layer 1 can be brought into not less than a double figure.

Where IGO is used in the material layer 1 and IGZO is used in the material layer 2, an alkaline etching solution having ammonia concentration within the range of 6.4% by mass or more and 10.5% by mass or less is used, so that the etching selectivity of the material layer 2 to the material layer 1 can be brought into approximately from 3.1 to 3.8. The etching in this Example can be carried out to selectively etch only the material layer 2, where the etching can be stopped at the surface of the material layer 1. That is, the etching can be carried out so that the Δd becomes substantially zero.

This etching can solve the problem of scattering of resistance when the thin-film transistor having the structure shown in FIGS. 7A and 7B is fabricated, and enables the thin-film transistor to have uniform characteristics.

Thin-film transistors fabricated according to the present invention can be fabricated on, e.g., plastic films, and hence, are applicable also in the field of pixel drivers of flexible displays, IC cards for certification, merchandise IC tags, etc.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-328204, filed Dec. 5, 2006, which is hereby incorporated by reference herein in its entirety.

The invention claimed is:

1. An etching method for etching an amorphous oxide semiconductor film including indium and at least one of gallium, zinc or a combination of gallium and zinc;
    the method comprising subjecting the amorphous oxide semiconductor film to selective etching relative to indium tin oxide (ITO) with an alkaline etching solution.

2. The etching method according to claim 1, wherein the amorphous oxide semiconductor film contains gallium, zinc and indium.

3. The etching method according to claim 1, wherein the etching solution contains ammonia in a concentration selected within the range of 4.6% by mass or more and 28% by mass or less.

4. A pattern forming process for forming a pattern of an amorphous oxide semiconductor; the process comprising the steps of:
    forming an amorphous oxide semiconductor film including indium and at least one of gallium, zinc, or a combination of gallium and zinc; and
    subjecting the amorphous oxide semiconductor film to selective etching relative to indium tin oxide (ITO) with an alkaline etching solution.

5. The pattern forming process according to claim 4, wherein the amorphous oxide semiconductor film is formed on an oxide layer different in compositional ratio from the amorphous oxide semiconductor film.

6. The pattern forming process according to claim 4, wherein the amorphous oxide semiconductor film includes gallium, zinc and indium.

7. The pattern forming process according to claim 4, wherein the etching solution contains ammonia in a concentration selected within the range of 4.6% by mass or more and 28% by mass or less.

8. A thin-film transistor fabrication process comprising the step of forming source and drain electrodes, a gate electrode, a gate insulating layer and a semiconductor layer;
    wherein the step of forming the semiconductor layer comprises the steps of:
    forming an amorphous oxide semiconductor film including indium and at least one of gallium, zinc, or a combination of gallium and zinc; and
    subjecting the amorphous oxide semiconductor film to selective etching relative to indium tin oxide (ITO) with an alkaline etching solution.

9. The thin-film transistor fabrication process according to claim 8, wherein the etching solution contains ammonia in a concentration selected within the range of 4.6% by mass or more and 28% by mass or less.

* * * * *